United States Patent [19]
Yamada

[11] Patent Number: 5,148,013
[45] Date of Patent: Sep. 15, 1992

[54] SOLID STATE IMAGING DEVICE AND METHOD OF DRIVING THE SAME

[75] Inventor: Tetsuo Yamada, Yokohama, Japan

[73] Assignee: Kabushiki Kaisha Toshiba, Kawasaki, Japan

[21] Appl. No.: 725,682

[22] Filed: Jul. 3, 1991

[30] Foreign Application Priority Data

Jul. 4, 1990 [JP] Japan .................... 2-176612

[51] Int. Cl.⁵ .......................... H01J 40/14
[52] U.S. Cl. .................. 250/208.1; 358/213.23
[58] Field of Search ............ 250/208.1, 208.2; 358/213.23, 213.27, 213.29, 909

[56] References Cited

U.S. PATENT DOCUMENTS

| | | | |
|---|---|---|---|
| 4,447,735 | 5/1984 | Horii | 358/213.23 |
| 4,581,652 | 4/1986 | Kinoshita et al. | 358/213.23 |
| 4,831,453 | 5/1989 | Takemura | 358/213.23 |
| 4,897,728 | 1/1990 | Yamada | 358/213.23 |
| 5,043,819 | 8/1991 | Cheon et al. | 358/213.23 |

FOREIGN PATENT DOCUMENTS

| | | |
|---|---|---|
| 0262665 | 4/1988 | European Pat. Off. |
| 0315778 | 5/1989 | European Pat. Off. |
| 0329189 | 8/1989 | European Pat. Off. |
| 60-163464 | 2/1984 | Japan |
| 61-99474 | 5/1986 | Japan |

Primary Examiner—David C. Nelms
Assistant Examiner—T. Davenport
Attorney, Agent, or Firm—Foley & Lardner

[57] ABSTRACT

There is disclosed a solid-state imaging device comprising: a column direction transfer section arranged in parallel to photosensitive element trains, and capable of transferring, in column directions opposite to each other, signal charges produced in photosensitive elements; row direction transfer sections arranged on the both end sides of the column direction transfer section, respectively, and at least one transfer order conversion section provided between the row direction transfer section on one side and the column direction transfer section. In this solid-state imaging device, there is employed a scheme such that the transfer direction of the transfer in a column direction (first field transfer) of signal charges produced from photosensitive pixels of the odd rows and the transfer direction of the transfer in a column direction (second field transfer) of signal charges produced from photosensitive pixels of the odd rows are caused to be opposite to each other, and that the transfer order is reversed by the transfer order conversion section on one side to output signal charges in a reversed transfer order. Transfer between row direction transfer devices is therefore not required.

10 Claims, 3 Drawing Sheets

SOLID STATE IMAGING DEVICE AND METHOD OF DRIVING THE SAME

BACKGROUND OF THE INVENTION

This invention relates to a solid-state imaging device and a method of driving the same, and more particularly to a solid state imaging device capable of independently and simultaneously reading out all pixel signals and a method of driving such an imaging device which is used in broadcasting CCDs, high-picture quality civil use CCDs, electronic cameras, etc.

As a CCD area sensor capable of providing a high resolution of the solid state imaging devices using a charge transfer device, there is known a CCD area sensor in which photosensitive elements producing signal charges of two pixels constituting one line are arranged adjacently to each other in a column direction (vertical direction). However, in CCD area sensors generally used as the area sensor for civil use, from a view point of the requirement of miniaturization, in order to reduce the number of transfer stages requiring a broad area, a readout system is employed to add signal charges of two pixels adjacent in a column direction to read out the added one, with the result that signals outputted from the area sensor have a lowered resolution with respect to the column direction.

From the viewpoint of recent requirements of the high picture quality and the high resolution, there have been proposed various techniques as to the all pixel signal independent readout to simultaneously and independently read out all pixel signals without carrying out addition.

FIG. 1 is a plan view showing the outline of the configuration of a conventional solid state imaging device capable of simultaneously and independently reading out all pixel signals. For brevity of explanation, a solid-state imaging device in which the number of pixels is reduced will be described, but it should be noted that actual solid state imaging devices have exactly the same structure and perform the same operation except that actual solid state imaging devices have a larger number of pixels.

In this solid state pickup device, photosensitive elements 1 to 8 belonging to the first to the eighth rows constitute each photosensitive element train 10 in a row, and a column transfer section 20 is formed adjacently to each photosensitive element train 10. Each column transfer device 20 is such that one transfer stage is formed with respect to two photosensitive elements, and that it comprises transfer stages 11 to 14. In this example, there are formed sets of the photosensitive pixel trains 10 and the column transfer sections 20 corresponding to five columns.

At the lower portion of the column transfer section 20, a charge storage section 30 comprised of four transfer stages 21 to 24 are formed. There is employed an arrangement such that two columns of charge storage subsections 31 and 32 correspond to one column transfer section 20. Thus, signal charges transferred by the column transfer section 20 will be interchangeably transferred to the two columns of charge storage subsections 31 and 32.

Further, at the lower portion of the charge storage section 30, two rows of row direction transfer sections 33 and 34 including five transfer stages are formed, and output circuits 35 and 36 are connected to the final transfer stages, respectively. These row direction transfer sections 33 and 34 serve to receive signal charges transferred by the charge storage sections 31 and 32 to transfer them in directions of the output circuits 35 and 36, respectively. These output circuits serve to take out voltage signals from signal charges.

The procedure for concurrently reading out all pixel signals in such a conventional solid-state imaging device will now be described. It should be noted that signal charges produced from photosensitive elements 1 to 8 are respectively represented by reference symbols S1 to S8 in the following description.

First, signal charges S1, S3, S5 and S7 stored in the photosensitive elements 1, 3, 5 and 6 belonging to the odd row are respectively transferred to the transfer stages 14, 13, 12 and 11 to transfer these signal charges in a column direction by driving the column transfer section 20 to allow the charge storage subsection 31 to store them thereinto. It is now assumed that signal charges in the state where they are stored in the charge storage section 30 are represented by corresponding reference symbols with prime. Then, signal charges S2, S4, S6 and S8 belonging to the even rows are respectively transferred to the stages 14, 13, 12 and 11 of the column transfer section 20 to transfer these signal charges in a column direction to allow the charge storage subsection 32 pairing with the charge storage subsection 31 used in the last transfer to store them thereinto. Then, the respective five signal charges S1' and S2' stored in the transfer stage 24 of the lowermost stage of the charge storage section 30 are transferred in parallel to corresponding transfer stages of the row direction transfer sections at predetermined timings. Namely, five signal charges S1' in the charge storage subsection 31 are transferred to the row direction transfer section 34 via the row direction transfer section 33, and signal charges S2' in the charge storage, subsection 32 are transferred to the row direction transfer section 33 at the same timing as the timing at which the signal charge S1' is transferred from the row direction transfer section 33 to the row direction transfer section 34. The signal charges S1' and S2' transferred to these row direction transfer sections 33 and 34 are sequentially outputted at the same timing.

At a predetermined time after the signal charges S1' and S2' are all outputted, signal charges S3' and S4' in the charge storage section 30 are transferred to the row direction transfer sections 33 and 34 in accordance with a procedure similar to the above, and are outputted therefrom, respectively. It is to be noted that since image information shared by respective signal charges are prescribed by the time at which they are transferred from the photosensitive pixels to the first column transfer section, there would occur disagreement between image information of the odd row and that of the even row. However, by allowing the column transfer to be carried out at a high speed, such a disagreement can be held down to such an extent that there is no problem from a viewpoint of practical use.

At times subsequent thereto, by repeatedly performing such an operation, it is possible to read out signals from the all photosensitive pixels. The reason why the system of simultaneously reading out two rows is employed, is to cope with the interlacing operation in the ordinary television system.

As described above, in the prior art, it is required to transfer, via one row direction transfer section, one of even row charges and odd row charges to another row direction transfer section remote therefrom. To realize this, it is necessary to independently control signal charges produced at the photosensitive elements of the odd rows and signal charges produced at photosensitive elements of the even rows to transfer them. This results in the problems that the structure of the transfer section is complicated, and that transfer control of charges becomes complicated because transfer between row direction transfer sections must be carried out.

SUMMARY OF THE INVENTION

Accordingly, this invention has been made in order to solve the above-mentioned problems, and an object of this invention is to provide a solid-state imaging device capable of simultaneously and independently reading out all pixels without the necessity of charge transfer between row direction transfer sections, and a method of driving such a solid-state imaging device.

According to one aspect of this invention, there is provided a solid-state imaging device comprising: a photosensitive unit comprised of a plurality of photosensitive element trains arranged in a row direction, each of the photosensitive element trains comprising a plurality of photosensitive elements arranged in a column direction with two pixels constituting one line of an image being as a unit, column direction charge transfer means arranged adjacent to the respective photosensitive element trains, and adapted to receive signal charges produced at photosensitive pixels corresponding one pixel and the other pixel of the two pixels constituting one line to transfer them in first and second column directions opposite to each other, respectively, first row direction charge transfer means provided at one side transfer end position of the column direction charge transfer means, and for transferring, in a row direction, signal charges produced at the photosensitive element corresponding to one pixel of the two pixels constituting one line transferred by the column direction charge transfer means, second row direction charge transfer means provided at the other side transfer end position of the column direction charge transfer means, and for transferring, in the row direction, signal charges produced at the photosensitive element corresponding to the other pixel of the two pixels constituting one line transferred by the column direction charge transfer means, and transfer order conversion means for reversing the transfer order in a column direction of a signal charge train transferred by the column direction charge transfer means into one of an intermediate region between the column direction charge transfer means and the first row direction charge transfer means and an intermediate region between the column direction charge transfer means and the second row direction charge transfer means.

According to another aspect of this invention, there is provided a method of driving a solid-state imaging device comprising the steps of: transporting, to a column direction charge transfer section, signal charges stored for a predetermined time period in adjacent photosensitive elements belonging to one of the odd row and the even row of photosensitive elements in a matrix form, transferring signal charges in a first column direction by driving the column direction charge transfer section to allow transfer order conversion means provided adjacently to the end portion of the column direction charge transfer section to store them thereinto, transporting, to the column direction charge transfer section, signal charges stored for a predetermined time period in the adjacent photosensitive elements belonging to the other of the odd row and the even row, transferring signal charges in a second column direction opposite to the first column direction by driving the column transfer section, and transporting and transferring, to a second row direction charge transfer section, by one row, signal charges transferred in the second column direction by the column direction charge transfer section, and transporting and transferring signal charges stored in the transfer order conversion means to a first row direction transfer section by one row in synchronism with the above-mentioned transporting and transferring operation, to thus simultaneously read out signal charges in adjacent pixels.

In accordance with the solid-state imaging device and the method of driving the same according to this invention, row direction transfer sections are provided at the both transfer ends of the column direction transfer section provided adjacently to each photosensitive element train, respectively, and a transfer order conversion section is provided between the row direction transfer section on one side and the photosensitive element region. Further, the transfer direction of the column direction transfer (first field transfer) of signal charges produced from the photosensitive pixels of the odd rows and the transfer direction of the column direction transfer (second field transfer) of signal charges produced from the photosensitive pixels of the even rows are caused to be opposite to each other. In the row direction transfer section on one side, the transfer order is reversed by the transfer order conversion section, and are outputted from that row direction transfer section. Therefore, there is no need of transfer between the row direction transfer sections. For this reason, it is possible to provide a solid-state imaging device simple in structure, easy to control, and having a remarkably improved resolution, and a method of driving such an imaging device.

Since the transfer order conversion section constitutes a cyclic transfer path, it is possible to store signal charges in a smaller area.

Since the charge storage sections are provided at the both end portions of the column direction charge transfer section and at least one of them is caused to be constructed as the transfer order conversion section, the control of transfer of charges becomes easy. In addition, as the charge storage section, a charge storage section of the unidirectional transfer, type or a charge storage section of the cyclic transfer type may be arbitrarily used. Particularly in the case where two charge storage sections are both of the cyclic transfer type, since the paths for the charge transfer become equal to each other, the influences of noises become even, thereby making it possible to take out a uniform video output, and to freely take out a normal image and/or an image inverted in a vertical direction.

Further, when an approach is employed to carry out charge transfer in a column direction for a time period except for the readout period of signal charges, e.g., for a blanking interval, it is possible to prevent transfer noises from being superimposed on an output signal.

In addition, in accordance with the method of driving a solid-state imaging device according to this invention, an approach is employed to transfer signal charges produced at one of photosensitive pixels of the even rows and those of the odd rows to store them into the transfer order converter means, and an approach is employed in transferring and taking out signal charges produced at the other of photosensitive pixels of the even rows and those of the odd rows to drive the transfer order conversion means in an opposite direction thus to take out signal charges. Accordingly, transfer control between row direction transfer devices becomes unnecessary. Thus, the control can be simplified.

DESCRIPTION OF THE PREFERRED EMBODIMENTS

Several preferred embodiments of this invention will now be described with reference to the attached drawings.

Figure 2:
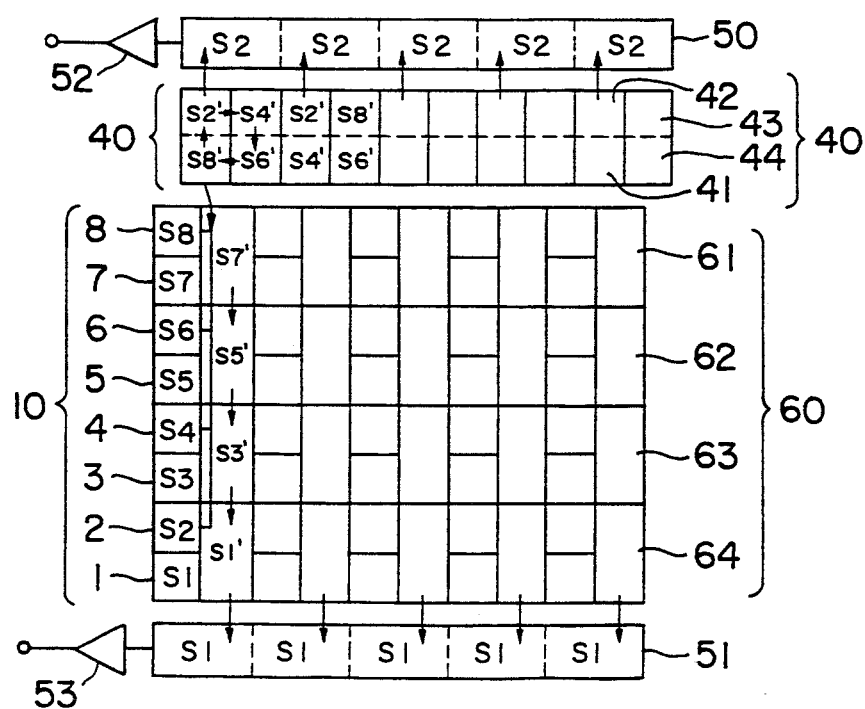
FIG. 2 is a plan view showing the structure of a first embodiment of a solid-state imaging device according to this invention.

FIG. 2 is a plan view showing the structure of a first embodiment of a solid-state imaging device according to this invention.

Figure 1:
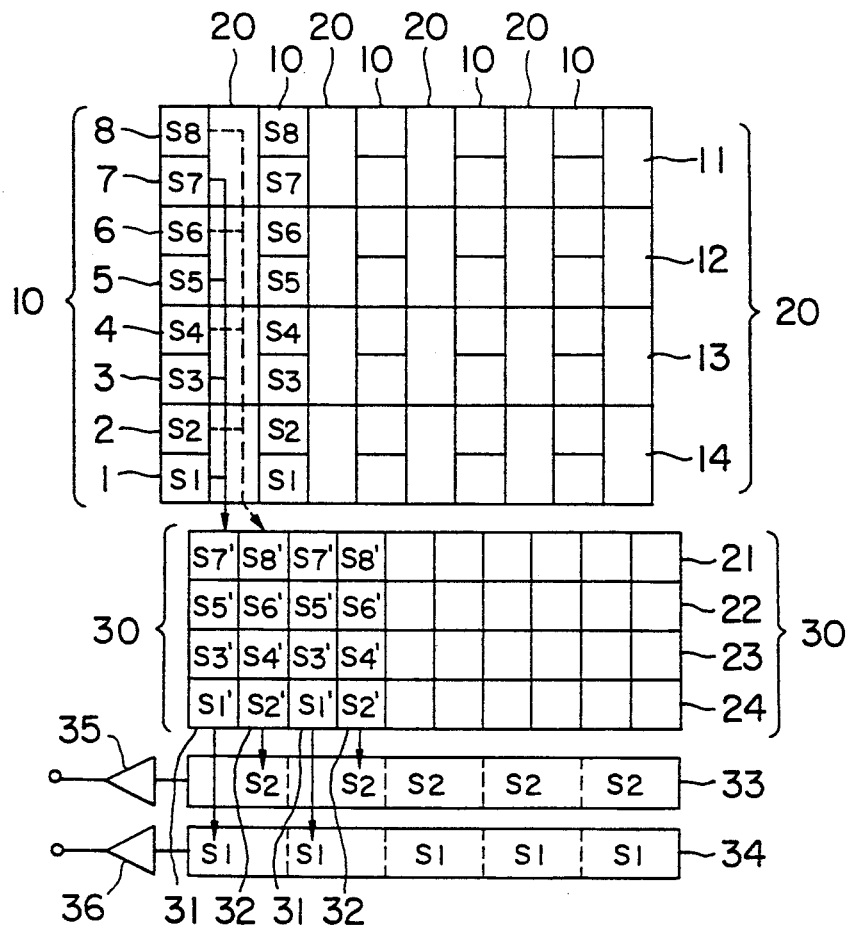
FIG. 1 is a plan view showing the structure of a conventional solid-state imaging device of the all pixel readout system.

A photosensitive element train 10 has the same configuration as that of the conventional device which has been described with reference to FIG. 1. Further, a column direction transfer device 60 provided in a row (lateral) direction adjacently to each photosensitive element train 10 includes four transfer stages 61 to 64. This column direction transfer section 60 differs from the conventional column direction transfer section 20 in that signal charges can be transferred in both directions (the upper direction and the lower direction in FIG. 2) of the column direction.

At the upper and lower positions of the terminating ends of the photosensitive element trains 10 and the column direction transfer sections 60, row direction transfer sections 50 and 51 are provided, respectively. Further, in this embodiment, between the row direction transfer section 50 on the upper side and the photosensitive element trains 10 and the column direction transfer sections 60, a transfer order conversion section 40 is provided. In the transfer order conversion section 40, five sets of transfer stages are provided so as to correspond with respective column direction transfer sections wherein each set is comprised of four transfer stages 41 to 44 of a matrix of two rows by two columns. This transfer order conversion section 40 serves to carry out a cyclic transfer in the clockwise transfer order of 41, 42, 43 and 44 or in the counterclockwise transfer order of 41, 44, 43 and 42. The detailed structure thereof is disclosed in U.S. Pat. No. 4,897,728 by the inventor of this invention.

The row direction transfer sections 50 and 51 serve to transfer signal charges from the right to the left of FIG. 2. Output circuits 52 and 53 for providing output voltages from the signal charges are connected to the respective final transfer stages.

As stated above, this embodiment is characterized in that there is provided the transfer order conversion section connected to the column direction transfer sections, and that two row direction transfer sections are provided in a manner that the photosensitive element matrix is put therebetween.

The operation of this embodiment will now be described.

First, signal charges S8, S6, S4 and S2 stored in the photosensitive elements belonging to the even rows are transferred to corresponding transfer stages 61 to 64 of the column direction transfer section 60. Then, column transfer is carried out from the bottom toward the top of FIG. 2 to transfer signal charges to the transfer order conversion device 40 connected to the row transfer section to store them thereinto. At this time, the transfer order conversion section 40 carries out a cyclic transfer in a clockwise direction, and thus carries out a transfer so that the charge S2 of the photosensitive pixel of the second row is finally stored into the transfer stage 42 of the transfer order conversion section 40. In FIG. 2, reference symbols S2', S4', S6' and S8' represent signal charges S2, S4, S6 and S8 in the storage state, respectively.

Then, signal charges stored in the photosensitive pixels belonging to the odd rows are transferred to the corresponding transfer stages 61 to 64 of the adjacent column direction transfer section. Reference symbols S1', S3', S5, and S7' in FIG. 2 represent signal charges S1, S3, S5 and S7 in the storage state which have been transferred in this way, respectively.

After a predetermined time has passed, the charge S1' of the first row stored in the transfer stage 64 of the column direction transfer section is transferred to the transfer stage of the row transfer section 51 corresponding to respective columns, and at the same time the charge S2' stored in the transfer stage 42 of the transfer order conversion section 40 is transferred to the transfer stages of the row transfer section 50 corresponding to respective columns. Thereafter, two row transfer sections sequentially transfer charges to the output circuits 52 and 53, respectively. Then, signal charges S1 and S2 of the first and second rows will be generally converted to voltage signals by output circuits 52 and 53 and are taken out therefrom.

By applying the similar operation to the signal charges S3, S4, S5, S6, S7 and S8, it is possible to read out charges of all photosensitive elements to the external independently and in accordance with the arrangement order of the photosensitive element trains. In this case, the transfer order conversion section 40 carries out a cyclic transfer in a counterclockwise direction every time alteration of signal charges to be read out is made.

In accordance with this embodiment, it is possible to independently and simultaneously output, to the external, signal charges of photosensitive element trains of adjacent two rows. Accordingly, it is possible to easily realize a solid-state imaging device which has no problems in the construction and manufacturing processes, and which can carry out an all pixel concurrent readout for realizing the parallel transfer function between row direction transfer sections.

While a procedure is taken in the above-described embodiment to first transfer signal charges from the photosensitive pixels of the even rows thereafter to transfer signal charges from the photosensitive pixels of the odd rows, such an order may be reversed.

Figure 3:
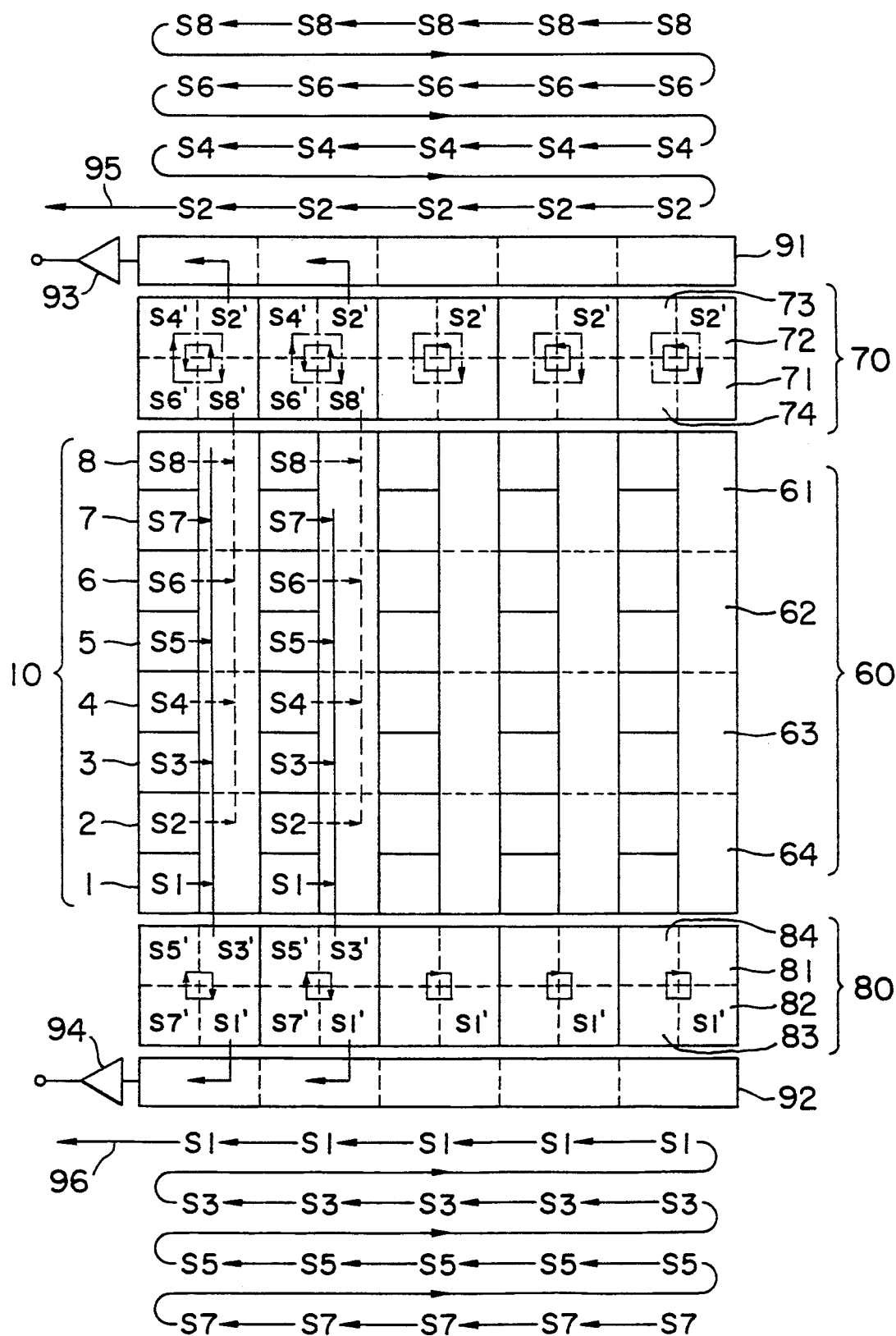
FIG. 3 is a plan view showing the structure of a second embodiment of a solid-state imaging device according to this invention.

The configuration of a second embodiment of this invention when viewed from the plane and movement of signal charges are shown in FIG. 3. The configurations of the photosensitive element train 10 and the column direction transfer section 60 are the same as those of the first embodiment.

This embodiment differs from the first embodiment of FIG. 2 in that cyclic transfer type charge storage sections 70 and 80 are provided at the upper and lower positions of the photosensitive element trains 10 and the column direction transfer sections 60, respectively. Namely, the first cyclic transfer type charge storage section 70 including transfer stages 71, 72, 73 and 74 is provided at the upper position of the photosensitive element trains 10 and the column direction transfer sections 60, and the second cyclic transfer type charge storage section 80 including transfer stages 81, 82, 83 and 84 is provided at the lower position of the photosensitive element trains 10 and the column direction transfer sections 60. Further, a row direction transfer section 91 adapted to receive signal charges from the first cyclic transfer type charge storage section 70 to carry out a transfer in a row direction toward an output circuit 93 is provided at the upper position of the first cyclic transfer type charge storage section 70, and a row direction transfer section 92 adapted to receive signal charges from the second cyclic transfer type charge storage section 80 to carry out a transfer in the row direction toward an output circuit 94 is provided at the lower position of the second cyclic transfer type charge storage section 80.

The operation of this embodiment will now be described.

First, when signal charges S2, S4, S6 and S8 stored in the photosensitive elements belonging to the even rows are transferred to corresponding transfer stages 64, 63, 62 and 61 of the column direction transfer section 60 to drive the column direction transfer section 60 so that transfer is carried out from the lower position to the upper position, signal charges are transferred in a counterclockwise direction to the transfer stages 71, 72, 73, 74 and 71 of the first cyclic transfer type storage section 70 in order of S8, S6, S4 and S2, and are stored in this order.

Subsequently, when signal charges S1, S3, S5 and S7 stored in the photosensitive elements belonging to the odd rows are transferred to corresponding transfer stages 64, 63, 62 and 61 of the column direction transfer section 60 to drive the column direction transfer section 60 from the upper position to the lower position, signal charges are transferred in a clockwise direction to the transfer stages 81, 82, 83, 84, 81 and 82 of the second cyclic transfer type storage section 80 in order of S1, S3, S5 and S7, and are stored in this order. In FIG. 3, reference symbols S2', S4', S6' and S8', and S1', S3', S5' and S7' represent signal charges respectively stored in the transfer order conversion sections 70 and 80.

After a predetermined hold time has passed, the signal charge S2' stored in the transfer stage 72 of the cyclic transfer type storage section 70 is transferred to the row direction transfer section 91, and the signal charge S1' stored in the transfer stage 82 of the cyclic transfer type storage section 80 is transferred to the row direction transfer section 92. As a result, voltages corresponding to the signal charges S2 and S1 are outputted from the output circuits 93 and 94, respectively.

When a procedure is taken to drive the cyclic transfer type storage section 70 in a clockwise direction and to drive the cyclic transfer type storage device 80 in a clockwise direction, voltages corresponding to signal charges S4 and S3 are outputted. At times subsequent thereto, in the same manner as stated above, all signal charges can be independently read out from the two output circuits. At the top and the bottom of FIG. 3, time series of signal charges which are to be read out are shown by reference numerals 95 and 96.

In this embodiment, since the structure of the readout path passing through the column direction transfer section, the charge storage section, and the row direction transfer section is equivalent with respect to the charges from the photosensitive elements of the even rows and the charges from the photosensitive element of the odd rows, mixed quantities of noise components, etc. generated in the middle of transfer substantially become equal to each other. Accordingly, there is no possibility that video outputs from the odd rows and those from the even rows become unbalanced.

Further, while it is described in this embodiment that the cyclic transfer type storage section 70 selectively carries out a clockwise transfer and a counterclockwise transfer, and the cyclic transfer type storage section 80 carries out only a clockwise transfer, both of the cyclic transfer type storage sections may be of a structure capable of freely conducting switching between the clockwise transfer and the counterclockwise transfer. In this case, a normal image and a vertically reversed image can be freely taken out.

Figure 4:
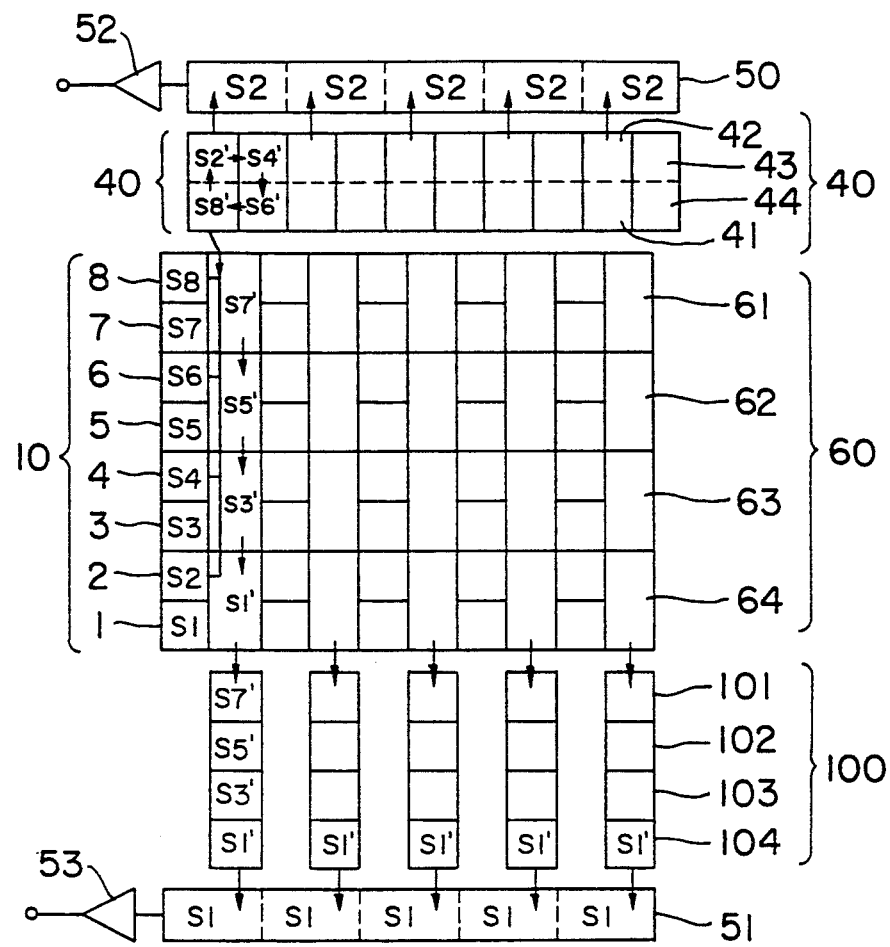
FIG. 4 is a plan view showing the structure of a third embodiment of a solid-state imaging device according to this invention.

FIG. 4 shows a third embodiment of an imaging device according to this invention wherein the storage section on the lower side of the column direction transfer section 60 is constituted with a unidirectional transfer section 100 including transfer stages 101, 102, 103 and 104 in place of the cyclic type transfer section. In the case of this embodiment, it is possible to take out a normal image by a more simple control.

Figure 5:
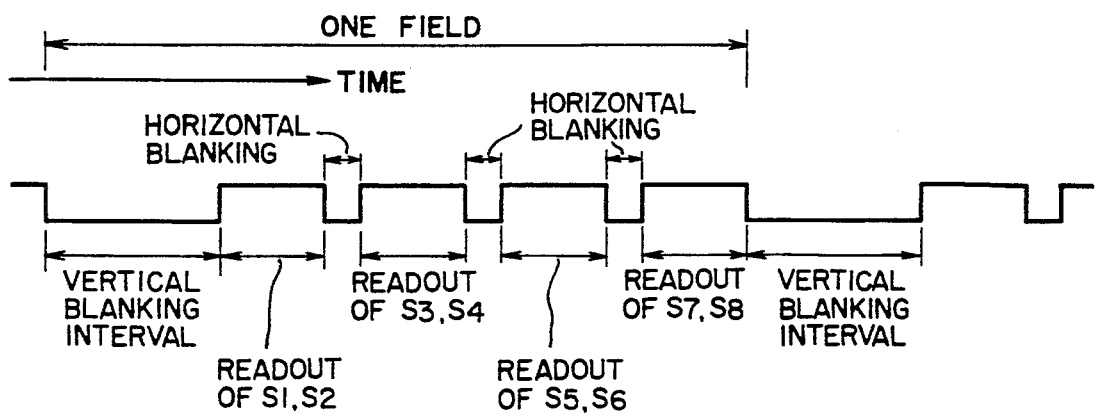
FIG. 5 is a timing chart showing an example of the transfer operation timing in the solid-state imaging device according to this invention.

FIG. 5 is a timing chart showing an example of the transfer operation timing in the solid-state imaging device according to this invention. This timing is in conformity with the ordinary television standard system. For a vertical blanking interval, the transportation of signal charges from the photosensitive elements to the column transfer section and the column transfer operation are carried out, and the conversion of the transfer order by the cyclic transfer is carried out according to necessity. Subsequently, before the completion of the vertical blanking interval, at least one parallel transfer to the two row direction transfer sections is carried out to output all the signal charges S1 and S2 to the external. Here, in the case of the NTSC standard, when it is assumed that the number of fields is 60 and the number of lines of one field corresponding to effective pixels is 256, the transfer time of one line is expressed as 20 H×1/60×1/256. In this case, 1H is about 64 micro seconds.

For the horizontal blanking interval, signal charges S3 and S4 are transferred in parallel. For the subsequent period, these charges are outputted to the external. By repeatedly carrying out the column transfer and the parallel transfer by making use of the blanking period, it is possible to independently output all charges to the external for one field period. Further, by carrying out column transfer and parallel transfer by making use of the blanking period, the mixing of a pulse for controlling the transfer operation for a readout period of signal charges can be prevented.

As stated above, in accordance with the solid-state imaging device according to this invention, row direction transfer sections are arranged on the both end sides of the column direction transfer sections, and at least one transfer order conversion means is provided between the row direction transfer section on one side and the column transfer section. Accordingly, there is no necessity of carrying out transfer between row direction transfer sections, the structure is simple, the control is easy, and the resolution can be remarkably improved.

In addition, in accordance with the method of driving a solid-state imaging device according to this invention, a procedure is taken to transfer signal charges produced at one of photosensitive pixels of the even rows and those of the odd rows to store them into the transfer order conversion means, and an approach is employed in transferring and taking out signal charges produced at the other of photosensitive pixels of the even rows and the those of odd rows to drive the transfer order conversion means in an opposite direction to take out them. Accordingly, transfer control between the row direction transfer sections becomes unnecessary and the control can therefore be simplified.

What is claimed is:

1. A solid-state imaging device comprising:
   a photosensitive unit comprised of a plurality of photosensitive element trains arranged in a row direction, each of said photosensitive element trains comprising a plurality of photosensitive elements arranged in a column direction with two pixels constituting one line of an image being as a unit,
   column direction charge transfer means arranged adjacent to said respective photosensitive element trains, and adapted to receive signal charges produced at photosensitive pixels corresponding one pixel and the other pixel of said two pixels constituting one line to transfer them in first and second column directions opposite to each other, respectively,
   first row direction charge transfer means provided at one side transfer end position of said column direction charge transfer means, and for transferring, in a row direction, signal charges produced at the photosensitive element corresponding to one pixel of said two pixels constituting one line transferred by said column direction charge transfer means,
   second row direction charge transfer means provided at the other side transfer end position of said column direction charge transfer means, and for transferring, in said row direction, signal charges produced at the photosensitive element corresponding to the other pixel of said two pixels, constituting one line transferred by said column direction charge transfer means, and
   transfer order conversion means for reversing the transfer order in a column direction of a signal charge train transferred by said column direction charge transfer means into one of an intermediate region between said column direction charge transfer means and said first row direction charge transfer means and an intermediate region between said column direction charge transfer means and said second row direction charge transfer means.

2. A solid-state imaging device as set forth in claim 1, wherein said transfer order conversion means constitutes a cyclic transfer path comprised of transfer stages connected in a loop form.

3. A solid-state imaging device comprising:
   a photosensitive unit comprised of a plurality of photosensitive element trains arranged in a row direction, each of said photosensitive element trains comprising a plurality of photosensitive elements arranged in a column direction with two pixels constituting one line of an image being as a unit,
   column direction charge transfer means arranged adjacent to said respective photosensitive element trains, and adapted to receive signal charges produced at photosensitive pixels corresponding to one pixel and the other pixel of said two pixels constituting one line to transfer them in first and second column directions opposite to each other, respectively,
   first row direction charge transfer means provided at one side transfer end position of said column direction charge transfer means, and for transferring, in a row direction, signal charges produced at the photosensitive element corresponding to one pixel of said two pixels constituting one line transferred by said column direction charge transfer means,
   second row direction charge transfer means provided at the other side transfer end position of said column direction charge transfer means, and for transferring, in said row direction, signal charges produced at the photosensitive element corresponding to the other pixel of said two pixels constituting one line transferred by said column direction charge transfer means, and
   first and second storage means for temporarily storing signal charges transferred by said column direction charge transfer means into an intermediate region between said column direction charge transfer means and said first row direction charge transfer means and an intermediate region between said column direction charge transfer means and said second row direction charge transfer means, one of said first and second storage means serving as transfer order conversion means for reversing the transfer order in a column direction of signal trains.

4. A solid-state imaging device as set forth in claim 3, wherein said transfer order conversion means constitutes a cyclic transfer path comprised of transfer stages connected in a loop form.

5. A solid-state imaging device as set forth in claim 3, wherein the other of said first and second storage means is storage means of the unidirectional transfer type.

6. A solid-state imaging device as set forth in claim 3, wherein said first and second storage means are both formed as a cyclic transfer path comprised of transfer stages connected in a loop form.

7. A method of driving a solid,-state imaging device comprising the steps of:
   transporting, to a column direction charge transfer section, signal charges stored for a predetermined time period in adjacent photosensitive elements belonging to one of the odd row and the even row of photosensitive elements in a matrix form,
   transferring signal charges in a first column direction by driving said column direction charge transfer section to allow transfer order conversion means provided adjacently to the end portion of said column direction charge transfer section to store them thereinto,
   transporting, to said column direction charge transfer section, signal charges stored for a predetermined time period in said adjacent photosensitive elements belonging to the other of the odd row and the even row, transferring signal charges in a second column direction opposite to said first column direction by driving said column transfer section, and transporting and transferring, to a second row direction charge transfer section, by one row, signal charges transferred in said second column direction by said column direction charge transfer section, and transporting and transferring signal charges stored in said transfer order conversion means to a first row direction transfer section by one row in synchronism with the above-mentioned transporting and transferring operation, to thus simultaneously read out signal charges in adjacent pixels.

8. A method of driving a solid-state imaging device as set forth in claim 7, wherein column direction transfer of signal charges carried out by driving said column direction charge transfer section is conducted for a time period during which no signal readout is carried out.

9. A method of driving a slid-state imaging device comprising the steps of:

transporting, to a column direction charge transfer section, signal charges stored for a predetermined time period in adjacent photosensitive elements belonging to one of the odd row and the even row of photosensitive elements in a matrix form, transferring signal charges in a first column direction by driving said column direction charge transfer section to allow first charge storage means provided adjacently to one end portion of said column direction charge transfer section to store them thereinto, transporting, to said column direction charge transfer device, signal charges stored for a predetermined time period in said adjacent photosensitive elements belonging to the other of the odd row and the even row, transferring signal charges in a second column direction opposite to said first column direction by driving said column direction charge transfer section to allow second charge storage means provided adjacently to the other end portion of said column direction charge transfer section to store them thereinto, and taking out signal charges from one of said first and second charge storage means in order of transfer and from the other thereof in an order opposite to the above to carry out transfer in a row direction, to thus simultaneously read out signal charges in adjacent pixels.

10. A method of driving a solid-state imaging device, wherein transfer in a column direction carried out by driving said column direction charge transfer section is conducted for a time period during which no signal readout is carried out.

* * * * *